(12) United States Patent
Mallinson

(10) Patent No.: US 9,264,019 B2
(45) Date of Patent: Feb. 16, 2016

(54) SUPPRESSION OF FIXED-PATTERN JITTER USING FIR FILTERS

(71) Applicant: ESS Technology, Inc., Fremont, CA (US)

(72) Inventor: A. Martin Mallinson, Kelowna (CA)

(73) Assignee: ESS Technology, Inc., Milpitas, CA (US)

( * ) Notice: Subject to any disclaimer, the term of this patent is extended or adjusted under 35 U.S.C. 154(b) by 0 days.

(21) Appl. No.: 14/321,390

(22) Filed: Jul. 1, 2014

(65) Prior Publication Data
US 2015/0003575 A1    Jan. 1, 2015

Related U.S. Application Data

(60) Provisional application No. 61/841,820, filed on Jul. 1, 2013, provisional application No. 61/856,848, filed on Jul. 22, 2013.

(51) Int. Cl.
| | | |
|---|---|---|
| *H03H 21/00* | (2006.01) | |
| *H03H 17/06* | (2006.01) | |
| *H03H 17/02* | (2006.01) | |

(52) U.S. Cl.
CPC .......... *H03H 17/06* (2013.01); *H03H 17/0229* (2013.01); *H03H 17/0248* (2013.01); *H03H 17/0286* (2013.01); *H03H 17/0294* (2013.01); *H03H 21/002* (2013.01); *H03H 21/0012* (2013.01)

(58) Field of Classification Search
CPC ............ H03H 21/0012; H03H 21/002; H03H 17/0294; H03H 17/0248

USPC ................. 375/226, 229, 232, 285, 350, 371; 708/300, 301, 306, 319, 322–323, 403, 708/819, 821; 703/1
See application file for complete search history.

(56) References Cited

U.S. PATENT DOCUMENTS

| | | | | |
|---|---|---|---|---|
| 6,072,881 | A  * | 6/2000 | Linder | 381/94.1 |
| 6,175,605 | B1 * | 1/2001 | Chi | 375/371 |
| 2003/0046037 | A1* | 3/2003 | Mashimo | 702/189 |
| 2006/0251200 | A1* | 11/2006 | Miller | 375/371 |
| 2007/0147559 | A1* | 6/2007 | Lapointe | 375/350 |
| 2012/0245901 | A1* | 9/2012 | Mallinson et al. | 703/1 |

* cited by examiner

*Primary Examiner* — Jean B Corrielus
(74) *Attorney, Agent, or Firm* — Gard & Kaslow LLP

(57) ABSTRACT

FIR filters for compensating for fixed pattern jitter, and methods of constructing the same, are disclosed. In one embodiment, a FIR filter filters a signal having a desired frequency component, with the coefficients of the FIR filter selected so that the filter is the equivalent of two combined FIR filters, one having the desired frequency at the filter's peak output frequency, and a second in which the signal is delayed by a time equal to half of a period of a different frequency which is desired to be removed from the output signal. In another embodiment, a FIR filter includes a delay line with a total delay longer than the period of the jitter. A signal is passed down the delay line, the number of signal edges that have occurred as the signal passes each delay element in the counted. Drivers corresponding to the delay elements in which a number of signal edges occur at the desired frequency during the period of fixed pattern jitter activate impedance elements attached to those delay elements. A processor configures the activated impedance elements to provide the desired filter response.

8 Claims, 8 Drawing Sheets

SUPPRESSION OF FIXED-PATTERN JITTER USING FIR FILTERS

This application claims priority from Provisional Applications Nos. 61/841,820, filed Jul. 1, 2013, and 61/856,848, filed Jul. 22, 2013, which are incorporated by reference herein in their entirety.

FIELD OF THE INVENTION

The present invention relates generally to finite impulse response (FIR) filters, and more particularly to using a FIR filter to suppressing a certain type of jitter.

BACKGROUND OF THE INVENTION

A useful application in integrated circuits is a frequency multiplier, in which an input signal of one frequency is multiplied by a fixed integer to create a signal of a higher frequency. For example, the output of a clock circuit at one frequency may be multiplied by an integer to generate a higher frequency clock signal.

Various ways to do frequency multiplication are known in the art. For example, a delay locked loop having N elements may be used, and taps taken from each of the N elements which are then combined to create a number of clock edges that is N times higher than the frequency that is applied to the delay locked loop.

Typically, the limiting factor in such a frequency multiplier, or other similar multipliers, is that the multiplier circuit may, due to inaccuracies in its implementation, generate jitter in the edge positions. Jitter means that the positions of each of the newly generated edges ate not precisely where they should be, i.e., the new edges in between the edges of the original signal are not located at precisely the equidistant positions that a mathematical calculation would predict.

For example, a device intended to multiply an input dock signal of 5 megahertz (MHz) by four will create four output pulses, and thus 8 output edges rather than the 2 output edges of the original 5 MHz input signal. These newly generated edges may each systematically deviate from the ideal equidistant times at which they are desired to occur. In one circuit, the first edge, which should occur after 25 nanoseconds (NS), might occur at 24 NS, the second edge, which should occur at 50 NS, might occur at 53 NS, etc.

Many designers, if not most, will assume that the deviation from the ideal position of each of the newly generated dock edges is random, i.e., noise created by a Gaussian distribution of undesired frequencies around the desired frequency. The most common way that most designers will try to correct for this is by using a high-Q filter to narrow the range of noise, although high-Q filters are difficult to implement well and are not easily adjustable if the desired clock frequency changes.

What most designers fail to realize, however, is that such jitter comes from two effects. One effect is a random variation of the edge position, such as is widely believed. But the other effect is a systematic variation in edge position due to repeatable artifacts in the elements of the circuit mechanism being used to multiply the signal.

The systematic type of variation gives rise to a characteristic non-random error that repeats in each cycle of the applied input signal, i.e., the error in the position of the clock edges will to a large degree be the same during the next cycle of the input frequency because the same error is present on each of the output phases for each input signal. This type of jitter is sometimes known as "fixed pattern jitter," because it thus repeats in a pattern over some time interval, i.e., at fixed frequencies, typically the time interval of the input clock signal.

FIG. 1 shows a curve 100 of the Fourier transform of (i.e., the frequencies contained in) a 20 MHz signal created by multiplying a 5 MHz signal by 4 as above. As expected, the peak response is in the middle of the x-axis, at 20 MHz, and noise appearing on either side of this peak response primarily at frequency intervals of 5 MHz, with the two closest frequencies, 15 MHz and 25 MHz, being the highest intensity of the noise frequencies. If the edge positions are plotted as a deviation from their ideal positions, the signal represented by the Fourier transform of FIG. 1 is shown in FIG. 2, in which curve 202 shows the positive edge error and curve 204 shows the negative edge error. The edges vary from their ideal positions by as much as +4 NS.

As will be apparent to one of skill in the art, any signal with a repeating pattern may be described as a spectrum consisting of discrete values, i.e., a Fourier transform. Thus, if these discrete tones in the spectrum can be suppressed, the fixed pattern portion of the jitter may be greatly reduced or eliminated.

It is thus desirable to construct a circuit that is able to eliminate such fixed pattern jitter in clock multiplier and other types of circuits.

SUMMARY OF THE INVENTION

A FIR filter, and methods for constructing such a filter, which compensates for fixed pattern jitter are disclosed.

One embodiment discloses a method of designing a finite impulse response filter for removing fixed pattern jitter from a signal having a desired output frequency, the filter having a delay line containing a plurality of delay elements, comprising: selecting a desired peak frequency response for the filter; selecting a plurality of elements having impedances, one element to be coupled to the delay line after each delay element, the values of the elements selected to determine their impedances so that the filter is the equivalent of two filters, a first filter having a peak output frequency at the desired output frequency or a band pass range that includes the desired output frequency, and a second filter in which the signal is delayed by a time equal to half of a period of a different frequency which is desired to be removed from the output signal; and providing an output connected to all of the impedance elements.

Another embodiment discloses a finite impulse response filter for removing fixed pattern jitter from a signal having a desired output frequency, comprising: an input for receiving the signal; a delay line containing a plurality of delay elements; a plurality of elements having impedances, one element coupled to the delay line after each delay element, the values of the elements selected to determine their impedances so that the filter is the equivalent of two filters, a first filter having a peak output frequency at the desired output frequency or a band pass range that includes the desired output frequency, and a second filter in which the signal is delayed by a time equal to half of a period of a different frequency which is desired to be removed from the output signal; and an output connected to all of the impedance elements.

Still another embodiment discloses a finite impulse response filter for removing fixed pattern noise from a signal having a desired output frequency, comprising: an input for receiving the signal; a delay line containing a plurality of delay elements, having a total delay that is longer than the period of the fixed pattern noise; a plurality of elements having impedances, one element coupled to the delay line after each delay element; a counter mechanism for counting the number of signal edges that have occurred as the signal passes each delay element in the delay line; a controller for: determining when the number of signal edges that occur at the desired frequency during the period of the fixed pattern has been reached and causing only the impedance elements in which those signal edges to be activated; and configuring the values of the activated impedance elements to provide a filter response having a peak output frequency at the desired output frequency or a band pass range that includes the desired output frequency; and an output connected to all of the impedance elements.

DETAILED DESCRIPTION OF THE INVENTION

Figure 1:
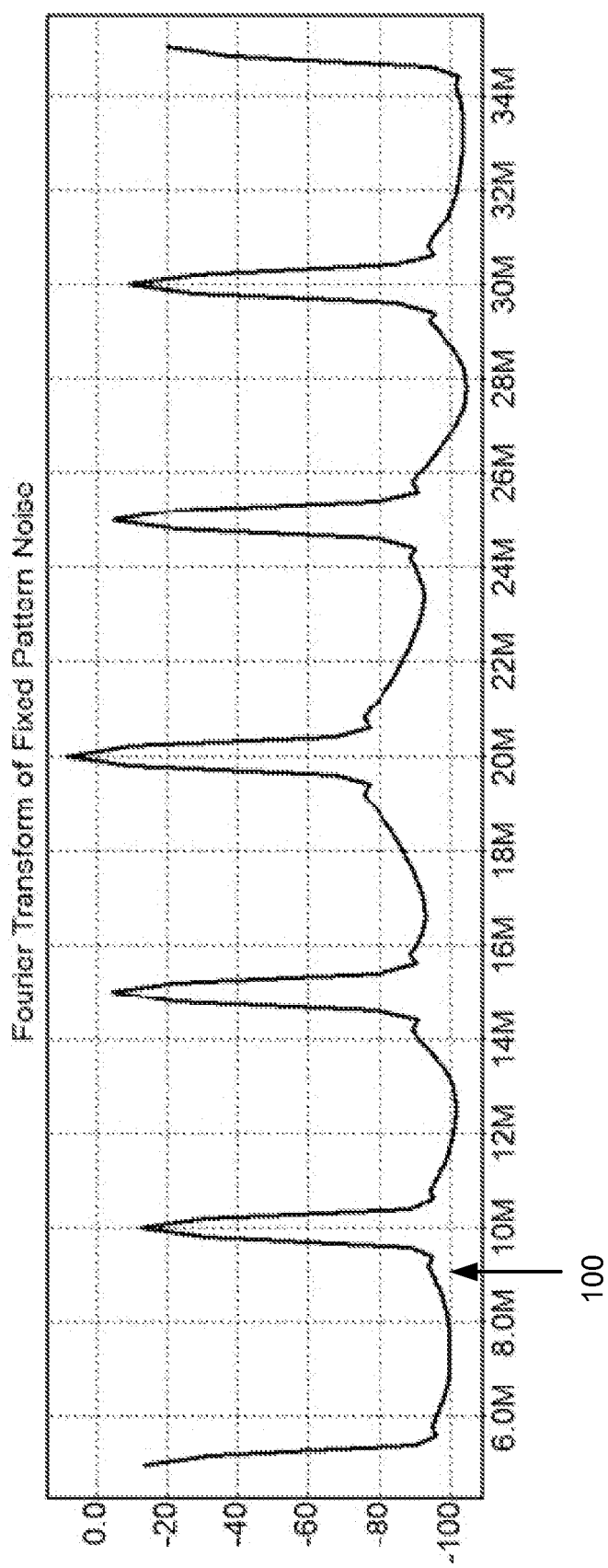
FIG. 1 is a graph of the Fourier transform of a 20 megaherts (MHz) signal created by multiplying a 5 MHz signal.

Described herein is a FIR filter for compensating for fixed pattern jitter, and the method of constructing such a filter.

In one embodiment, as FIR filter is used to filter a signal having a desired frequency component, with the coefficients of the FIR filter selected so that the filter is the equivalent of two combined FIR filters, a first FIR filter having the desired frequency of the signal at its peak output frequency (or within the band of a band pass filter), and a second FIR filter in which the signal is delayed by a time equal to half of a period of a different frequency which is desired to be removed from the output signal.

In another embodiment, a FIR filter includes a delay line in which the total delay is longer than the period of the fixed pattern jitter. A signal having a desired frequency is passed down the delay line, and a counter mechanism counts the number of signal edges that have occurred as the signal passes each delay element in the delay line. When the number of signal edges reaches the number of signal edges that occur at the desired frequency during the period of the fixed pattern jitter, drivers corresponding to the delay elements in which those signal edges occur activate impedance elements attached to those delay elements. A processor configures the activated impedance elements to provide the desired filter response.

As above, in an application such as a frequency multiplier, the total jitter in the timing of the new clock edges created by such as multiplier may not be just random jitter but may contain two kinds of jitter, both random jitter and a significant portion of fixed pattern jitter. The fixed pattern jitter is due to repeatable artifacts caused by the circuit elements being used to multiply the signal, and results in a systematic variation in the positions of the new dock edges that occur over the time period of the original, non-multiplied clock signal.

Once the existence of fixed-pattern jitter is recognized, it may be seen that the fixed-pattern jitter is represented by a series of peaks at specific frequencies, and may thus be reduced by the use of a FIR filter that has zero values at those frequencies. Since the fixed-pattern jitter occurs at specific frequencies, better jitter reduction is obtained by reducing noise at those frequencies than by trying to reduce all noise.

Because most designers do not appreciate the difference between the two types of jitter, they may attempt solutions that do not work very well. Some designers will recognize that it is possible to use filters to cause certain frequencies to have a zero amplitude (or near zero as it is very difficult to get a true zero value); for example, this principle is used to reduce interfering signals such as signals of television stations other than the one a user wishes to watch.

However, even given the ability to have zero values at some frequencies, most designers will also recognize that it is impossible to have zero values for all frequencies other than the desired one. In fact, the closer the undesired frequency is to the desired frequency, the harder it is to remove the undesired frequency. Faced with this reality, many or most designers will thus not even try to eliminate noise directly, but will instead use a high-Q filter to try to eliminate most frequencies other than the desired one. However, implementing a high-Q filter is not easy, and may lack flexibility if the desired clock frequency changes.

Consider as an example, a circuit that multiplies a 40 MHz signal to get a 160 MHz signal. Clock frequency multipliers are frequently constructed using phase locked loops (PLLs). In the frequency domain a 160 MHz signal in its pure form is a spike at 160 MHz with no energy elsewhere. However, phase locked loops suffer from Gaussian jitter, and thus using a phase locked loop to get the desired multiplication will typically result in a Gaussian distribution of noise; due to the jitter the frequency response will not appear as a spike, but will instead appear as a Gaussian distribution running from perhaps 155 MHz to 165 MHz. In the time domain, the new clock edges will not appear precisely where they are desired, but will dither, possibly by about 1 NS.

Again, because many designers believe all of the noise to be random, the typical solution is to apply a high-Q filter with a peak band-pass at 160 MHz; this will turn the signal into one having a narrower frequency distribution, but still a Gaussian one, from perhaps 159 MHz to 161 MHz, and the dither in the clock edges will similarly be reduced but still present.

However, implementing such a high-Q filter with a phase locked loop is not easy. The value of Q must be at least 16 to have any effect at all (Q needs to be greater than the signal frequency, here 160 MHz, divided by the noise bandwidth, here 10 MHz, i.e., 160/10=16), and a value of Q of over a 100 is preferable. Further, the high-Q filter must be well centered on the desired frequency of 160 MHz, or it will suppress that frequency as well as the undesired ones. Finally, if for some reason a new frequency is desired from the phase locked look, for example an output signal of 200 MHz rather than 160 Mhz, the high-Q filter must also be changed or it will suppress the new 200 MHz frequency, just as it suppresses the 200 MHz frequency when the desired frequency is 160 MHz.

An alternative way to make a clock frequency multiplier is by using a delay locked loop (DLL) rather than a phase locked loop. Delay locked loops are in some respects a better choice for frequency multipliers, as they are much easier to make than the combination of a phase locked loop and a high-Q filter. Using a delay locked loop to multiply the 40 MHz signal may result in about the same distribution of 159 MHz to 161 MHz as a phase locked loop with a high-Q filter when each of the generated edges are examined individually, but when the clock edges are compared to each other a jitter will be seen.

Delay locked loops introduce only fixed pattern jitter, and have negligible, or at least substantially less, Gaussian jitter. While the new clock edges as output by the delay locked loop may initially have about the same amount of dither as those of the clock edges from a phase locked loop and high-Q filter, the fact that the dither in the output of the delay locked loop frequency multiplier is not due to random noise but to fixed pattern jitter allows the dither to be greatly further reduced.

In the frequency domain, the fixed pattern jitter of a delay locked loop appears as noise at other frequencies that are not a Gaussian distribution like noise from a phase locked loop, but rather, like the desired output frequency, are also multiples of the input frequency. Thus, in addition to the peak desired output signal at 160 MHz, there will be smaller peaks at 80 MHz, 120 MHz, 200 MHz, etc., which are undesired noise. The largest peaks of noise will be the ones with the closest frequencies to the desired frequency of 160 MHz, i.e., 120 MHz and 200 MHz.

Figure 3:
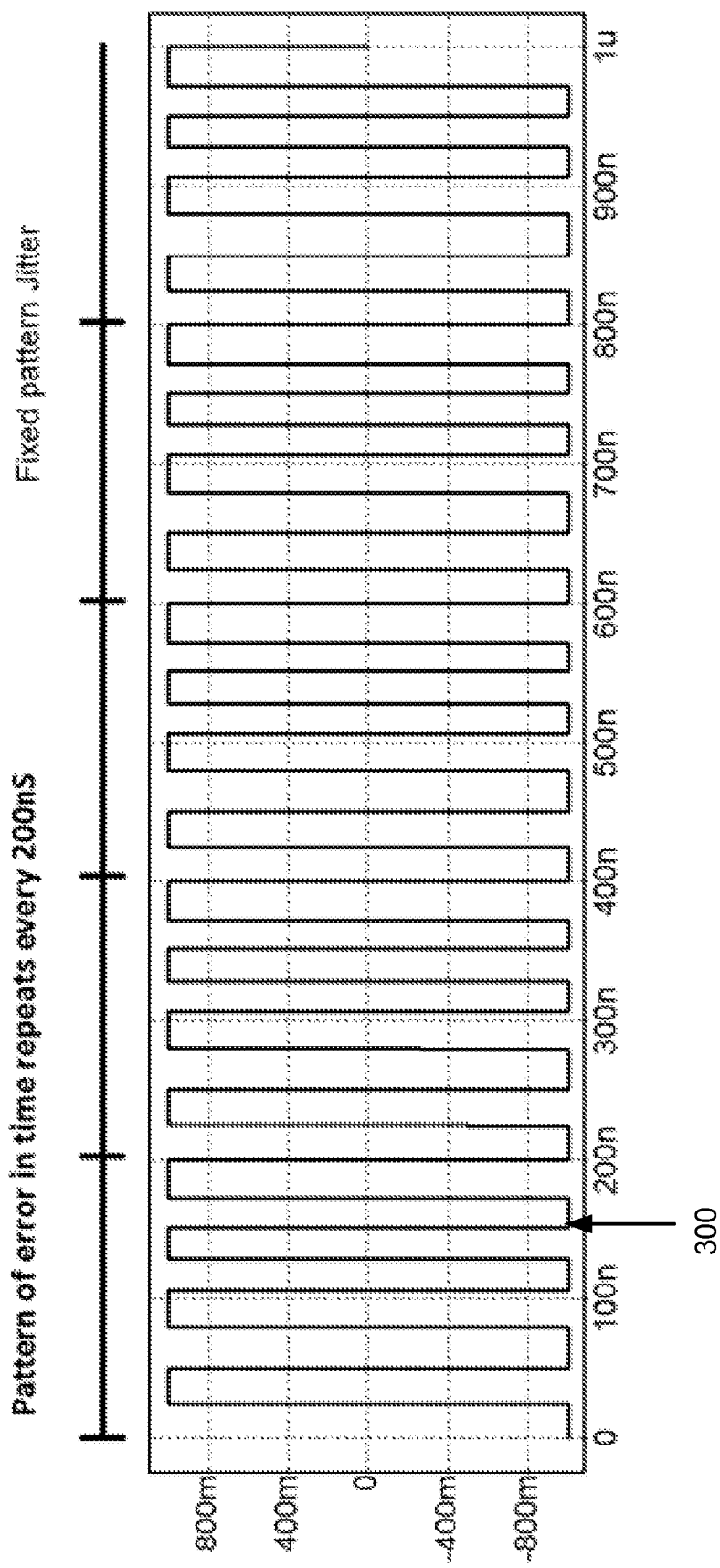
FIG. 3 is a graph of output pulses that are nominally at a frequency of 20 MHz showing typical fixed pattern noise.

FIG. 3 shows a curve 300 of output pulses that are nominally at a 20 MHz frequency as represented by the Fourier transform of FIG. 1, showing how the fixed pattern noise of the type shown in the frequency domain FIG. 1 is manifested in the time domain. It will be seen that the edges are irregular, and thus that while they have an average frequency of 20 MHz they do not perfectly align to their ideal times.

It will thus be apparent to one of skill in the art that such noise at specific frequencies in the frequency domain, which is reflected as dither in the edges of the new dock signals in the time domain, may be reduced by reducing the noise in the frequency domain, i.e., the extraneous frequencies at 15 MHz, 25 MHz, etc. This may be accomplished by the use of a finite impulse response (FIR) filter with zero values at the undesired frequencies.

Figure 4:
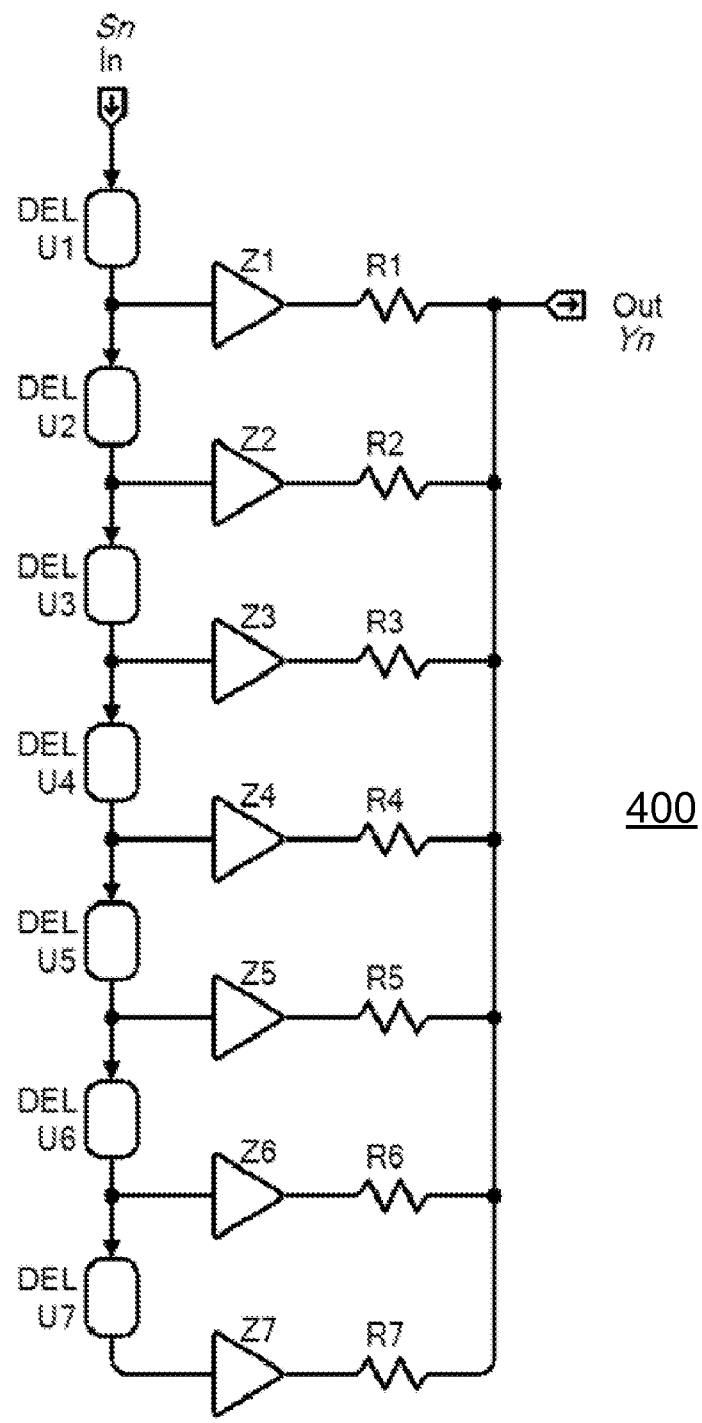
FIG. 4 is a block diagram of a finite impulse response (FIR) filter as known in the art.
Figure 5:
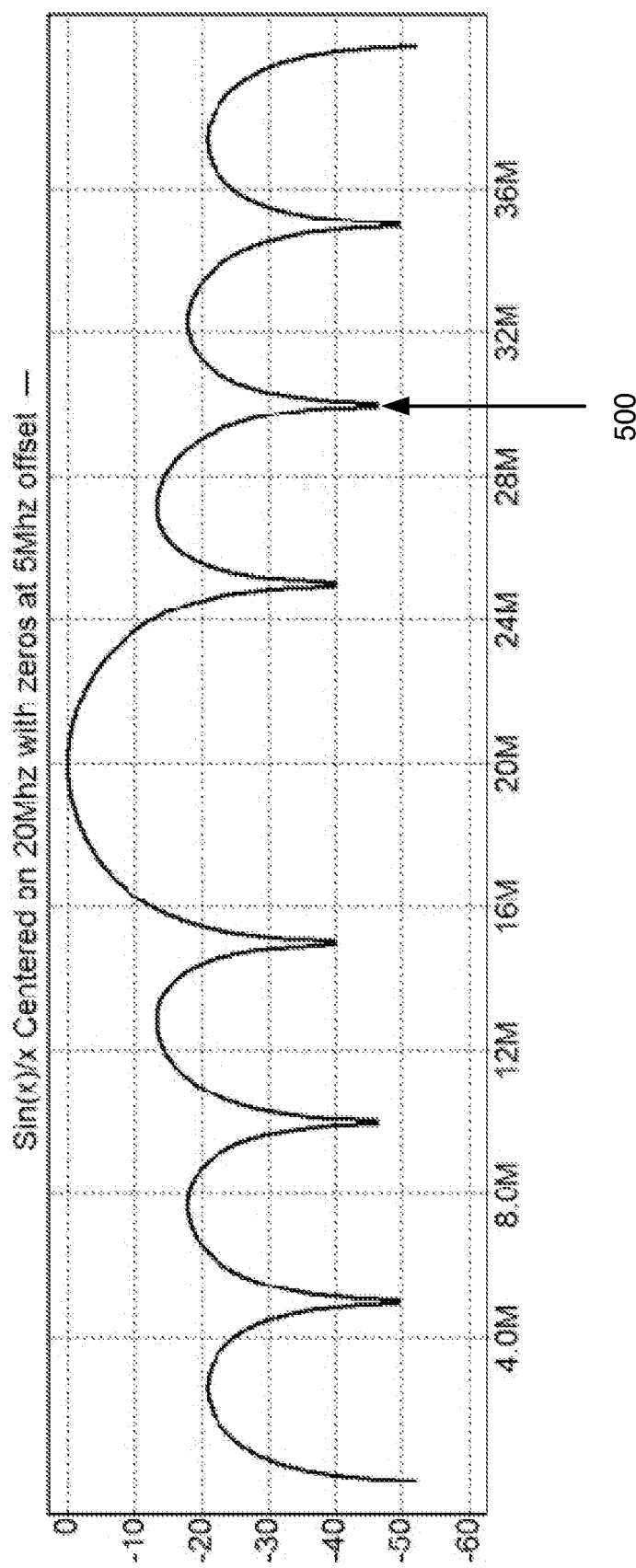
FIG. 5 is a graph of a rectangular window function in the frequency domain.

A FIR filter is a type of electronic filter with a broad range of applications. FIR filters are widely used in both digital signal processing and digital video processing, and their construction is well known in the prior art. One type of FIR filter is a transversal filter, or tapped delay line filter, as shown in FIG. 4. The output of such a filter 400 is a weighted combination of voltages taken from uniformly spaced taps. The filter contains a plurality (here 7 are shown) of unit delay elements U1 to U7, each of which introduces a delay of time t. The filter is considered to be of the Mth order, where M-1 is the number of delay elements, so the filter of FIG. 5 is an 8 order filter.

The output of each of the delay elements U1 to U7 is connected to an element having an impedance value, typically through some buffering means, such as buffers Z1 to Z7; here, the elements having impedance values are shown as resistors R1 to R7. One of skill in the art will recognize that while this example and the following discussion use resistors to indicate the impedance values for purposes of illustration, other circuit elements also have impedance values, for example, capacitors, inductors, depletion mode MOSFETs, and other devices, and any device having an impedance that does not otherwise interfere with operation of the filter may be used to provide the desired impedance values as described herein.

The resistors all share a common output point. As an input signal progresses through the delay elements, each resistor causes the signal on the respective delay element to which it is attached to contribute to the output signal in inverse proportion to the resistor value. Thus, if the resistor is small, the signal on the attached delay element will have a large contribution to the output voltage, while if the resistor is large the contribution to the output will be smaller.

It is well known that the mathematical basis of a FIR filter is the mathematics of Fourier transforms, and is characterized by a convolution of the successive values of the input signal with a set of values referred to as the impulse response of the filter. The output of the filter is a weighted sum of the current input value and a finite number of previous values of the input. When a delay element operates on an input $S_n$, the current output is $S_{n-1}$, i.e. the input one delay period before. Thus, $S_{n-k}$ is the filter input at a time $T_0$ plus (n-k)*t, which is also the output of the kth delay element at time plus n*t. Each buffer/resistor combination Z1/R1 to Z7/R7 acts as a multiplier and multiplies the tap input to which, it is connected by a filter coefficient referred to as the tap weight $W_k$ so that the multiplier connected to the kth tap input $S_{n-k}$ produces an output $S_{n-k}*W_k$. The resistor (or impedance) values are the inverse of the Fourier coefficients in the series.

The outputs of the resistors R1 to R7 are summed to produce the fitter output. For an Nth order filter, this overall output $Y_n$ is given by the formula:

$$Y_n = W_0 * S_n + W_1 * S_{n-1} + W_2 * S_{n-2} + \ldots + W_N * S_{n-N}$$

or $$Y_n = \sum_{k=0}^{N} S_{n-k} * W_k$$

Thus, by properly selecting the resistor values in a set of resistors, a FIR filter may be designed to provide an output with a desired frequency response. The resistor values are typically calculated by a software program which takes the desired frequency response as an input.

It is also a well-known property of the Fourier transform that a frequency shift corresponds to a multiplication of the coefficient values by $e^{i\omega x}$, i.e., by a complex sinusoidal term. Consequently, the coefficient values representing a single non-zero value in the frequency domain are of the form $e^{i\omega x}$, i.e., they are sinusoidal and extend to infinity. Thus, in order to construct a perfect filter, an infinite sequence of coefficient values, i.e., delay elements and resistors, are required.

Since any practical implementation can of course not be of infinite extent, and generally must be quantized in time and amplitude as well, a window function, or tapering function, is used. As is well known in the art, a window function is a function with a value of zero outside some chosen interval; one common type used in filters is a rectangular window, which lets a signal pass through when it is within the frequency bounds of the window, and results in a value of zero outside the window. The use of an appropriate window function limits the nominally infinite series of coefficients to a series of coefficients of finite length. Well known window functions such as the Kaiser window or Blackman window are examples of the results of work that has been done in the field over many years trying to determine how best to achieve such truncation of a coefficient series.

Using the example of the 20 MHz signal obtained by multiplying a 5 MHz signal above, in a first embodiment a first FIR filter is designed with resistance values that will create a band-pass filter with a peak at the desired 20 MHz signal. As is known in the art, passing the signal through this filter alone will slightly reduce the noise in the signal and reduce jitter, since any such filter has some value of Q.

However, much greater improvements are obtained by adding additional FIR filters that, when added to the output of the first FIR filter, will result in zero values at particular frequencies. This is done by assuming a second FIR filter that is a duplicate of the first FIR filter, and delaying the signal to the duplicate filter by a time equal to half of the period of the frequency at which the zero value is desired.

For example, for the 25 MHz frequency, since a cycle at that frequency has a period of 40 NS, if the signal to the second FIR filter is delayed by 20 NS, and the outputs of the two filters added together, the value of the 25 MHz frequency will near zero. (It is nearly impossible to get a value that is absolutely zero, but near zero values will greatly reduce the noise and jitter.)

Similarly, a third FIR filter can be added, and the signal delayed by about 33.33 NS, half of the period of a signal of 15 MHz. When the output of this signal is added to that of the first FIR filter, the value of the 15 MHz frequency will also be near zero. Additional FIR filters may be added to reduce the values at additional frequencies if desired to further reduce the noise and jitter.

These multiple FIR filters need not be physically constructed but may be conceptual designs; as is well known in the art, multiple FIR filters may be collapsed into a single filter, by simply adding all of the output values that occur at a specific point in time. Since the outputs of one or more of the filters will be delayed with respect to the first band pass filter, the output values at most points in time will be a sum from two or more of these conceptual filters.

For example, if the output of the first band pass filter is a string of values;

A B C D E F G etc.

and the output of one of the delay filters is a string of the same values delayed by a time equal to four elements of the delay line, so that, for example, a first output of the delayed signal from the second filter is A when the undelayed output of the first filter above is E, then the resulting added string will be A B C D E+A F+B G+C etc.

The coefficients of the single "collapsed" filter will reflect these outputs, by adding the conductances of the elements, so that if the resistor that results in output A is Ra, the resistor for output B is Rb, etc., then the resistor for E+A will be given by Rea=1/(1/Ra+1/Rb) (Where the outputs do not exactly coincide in time due to the delay time for a given undesired frequency, such as 40 NS for the 25 MHz signal described above, being offset from the times at which the first filter would be tapped, one of skill in the art will appreciate how to interpolate the values so as to perform this addition.)

Thus, in this embodiment, such a FIR filter representing a "collapsed" set of FIR filters which provide zero values for the unwanted frequencies, each of which is offset from the desired frequency by the frequency of the original non-multiplied clock signal, will greatly reduce the fixed pattern jitter. By using this technique, the jitter in the clock edges may be reduced from about 1 NS to as little at 100 picoseconds (PS), or ten percent of the previous jitter, and possibly less. One of skill in the art will appreciate that this is only one method of creating zeros in a FIR filter, and that other methods of creating zeros may be used to achieve the same result.

A second embodiment allows for the removal of the frequencies where the fixed pattern noise is present without the use of FIR filters to provide zero values as described above. Instead of making use of explicit zeros in the transfer function of the filter, this embodiment takes advantage of the fact that a filter that does not use a window function exhibits a response that is a curve of $sin(x)/x$.

The mathematical ideal of a Fourier transform of a signal at a single fixed frequency is a sinusoidal signal of infinite extent, and a perfect FIR filter would thus require an infinite number of elements. In practice it is well known that if a sinusoidal sequence is simply truncated in order to generate a finite number of coefficients of a FIR filter, the filter will exhibit a response of $sin(x)/x$, which may be considered as the Fourier transform of a rectangular window function.

Rather than considering which window function is the best, this embodiment rests on a consideration of the effect of the truncation, i.e., what happens to the signal response when the ideal impulse response is truncated to a serried of finite length as a result of the use of any window function.

FIG. 5 shows a curve 500 of a typical $sin(x)/x$ response, i.e., a rectangular window. A filter having such a response will generally be considered a poor filter for most uses, as the response from the peak generally rolls off very slowly. However, it is easily seen that there are a large number of zero values at repeated intervals from the center value of the filter. These zeros are exactly what is needed to suppress fixed pattern jitter, if the zero values can be made to occur at the same frequencies at which the fixed pattern jitter noise occurs.

Accordingly, in the example above of multiplying a 5 MHz signal to get a 20 MHz signal, if the zero values can be made to be at 5 MHz intervals from the 20 MHz peak, then the noise and jitter will be greatly reduced.

The position of the zeros is determined by the length of the FIR filter. If the total delay time in the filter is, for example, 200 NS, the zeros will occur at multiples of 5 MHz, since a 5 MHz signal has a period of 200 NS. Thus, if a FIR filter with a rectangular impulse response operates on a signal that has fixed pattern noise, and the total delay time of the filter is equal to the interval over which the fixed pattern repeats (or an integral multiple thereof), the artifacts of the fixed pattern will coincide with the zeros of the filter, so that the fixed pattern noise will be greatly suppressed at the output of the filter.

However, if the delay line is made from simple delay elements that are common in this area, the delay elements will exhibit variations in delay due to variations in the manufacturing process, the power supply, etc. It is thus necessary to continually adjust the delay elements such that the total delay time of the delay line is equal to the period of the input signal, or an integral multiple thereof. In addition, since the filter must be centered on the expected output frequency, the coefficients of the filter must be able to change as the delay time changes. These objectives may be accomplished by the use of an adaptive filter implementation.

Consider again the clock edges of the 20 MHz signal as shown in FIG. 3. In the adaptive filter implementation, these clock edges are sent down a delay line that is longer than the period of the original 5 MHz clock signal. For example, in one embodiment the delay line might be constructed of 256 elements in series, each element having a nominal delay of 1 NS. The total delay time of such a delay line will thus be 1 NS times 256, or 256 NS, longer than the 200 NS cycle period of the input 5 MHz signal.

As in a conventional FIR filter, each output from one of the 256 elements is connected to a resistor that forms one coefficient of the FIR filter. However, as will be explained, the driver for any given resistor may or may not be activated. If the driver for a resistor is not activated, the driver output is of high impedance and the coefficient is effectively of an infinite value so that it makes no contribution to the output of the filter.

It is by determining which drivers to activate that the length of the filter is set, since what matters is not the total length of the filter, but the length of those elements which are activated to actually drive coefficients. If only enough drivers are activated to make the delay of the active drivers 200 NS, then the pattern of frequencies at which the filter has zero values will fall on the same frequencies as the fixed pattern noise.

Thus, the length of elements to be activated must be determined. This may be accomplished in various ways. One way is to make a replica delay line and apply a 5 MHz signal to it, and then snapshot the position of the signal in the delay line and assess it. A linear control signal may then adjust a fixed number of delay elements to the required total time.

Another solution does not require a replica line or linear control elements, and will work with any reasonable set of delay times for the delay elements, even if those delay times vary between elements over the delay line due to, for example, manufacturing variations. A set of registers is arranged with a register adjacent to each delay element, such that when the registers are clocked they take a snapshot of the delay line, and a digital counter mechanism then counts the number of clock edges present in the delay line. (One desirable feature of a delay line constructed for a FIR filter is that each delay element typically inverts the signal, so that the absence of a transition actually indicates an edge has occurred, and thus the counter mechanism may simply count the number of "absences" of transition between delay elements.)

This counter mechanism may be conveniently distributed down the delay line, such that a counter adjacent to each delay element, each one receiving an input from the prior counter and adding a 1 or a 0 to the count depending upon the state of the adjacent delay element, and passing the new count on to the next counter.

If a running total of the number of clock edges is made available adjacent to each delay element in this way, the total may be used to determine whether to activate the local coefficient driver. Since the 20 MHz signal is 4 times the frequency of the 5 MHz input signal, 8 clock edges are desired. Thus, if the running total of the number of clock edges is between 0 and 8, then the adjacent driver will be made active; otherwise the driver remains in a high impedance state. (Note that any two numbers that differ by 8 may be used to control the drivers, as it only necessary that the activated drivers include a set of coefficients where the delay elements include 8 clock edges.)

Figure 8:
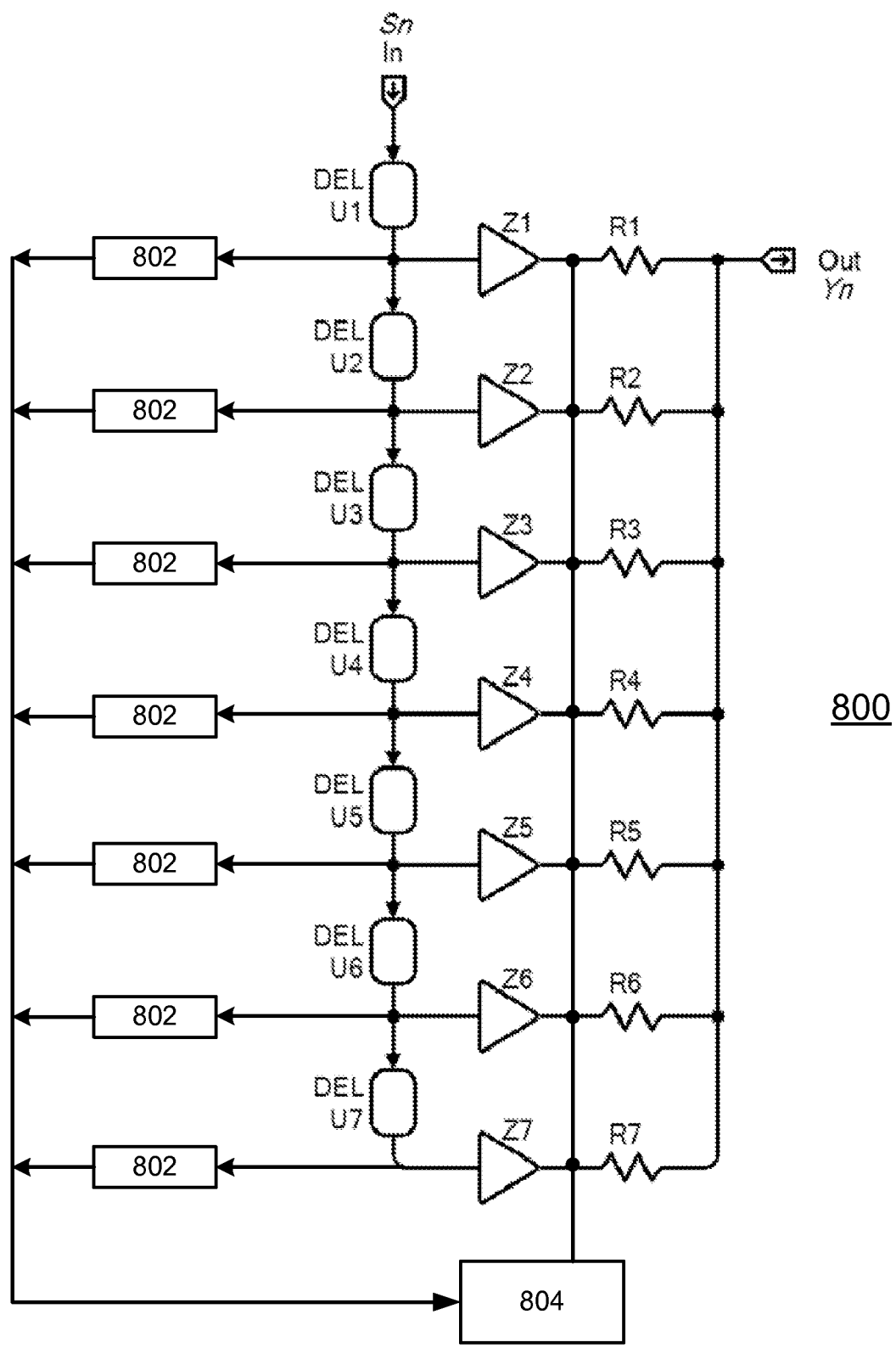
FIG. 8 is a block diagram of a FIR filter according to one embodiment.

FIG. 8 is a block diagram of a FIR filter 800 as described above. In addition to the standard components shown in FIG. 4, i.e., the delay line, buffers Z1-Z7, and resistors R1-R7, FIR filter 800 includes a plurality of counters 802 which count the number of signal edges that have occurred as the signal passes each delay element in the delay line, and a controller 804 which activates the appropriate impedance elements as explained above. (Of course, there will typically be more delay elements, buffers, resistors and counters in an actual implementation, for example 256 of each in the example above.)

This solves the first constraint, i.e., that the delay of the filter is equal to the interval over which the fixed pattern repeats, a cycle of the input clock signal. But as above a second constraint must also be met: the impulse response coded in the coefficients must be such that the center frequency of the filter is at the desired output frequency, here 20 MHz. In principle, this may be achieved by any means; for example, the length of the delay needed to make one interval is now known from the list of active drivers, and a processor may configure the coefficients based upon that interval.

A simpler means of obtaining the required frequency response if based upon the observation that the pattern present in the delay line is itself an approximation to the required impulse, since it is a square wave and represents a filter that has a fundamental at the required frequency. While there are other undesirable responses at 3, 5, 7, etc. times the fundamental frequency, for the intended purpose these can be ignored as long as they do not "fold back" into the hand of interest.

Such fold back occurs due to the quantization of time in the delay line; with an element delay of 1 NS, which may be typical, the images fold back after about 1 GHz (the frequency which has a cycle time of 1 NS). This ensures that the first problematic image in the filter is the image from any signal remaining at 980 MHz (which would fold hack to 20 MHz). However, since 980 MHz is so far above the region of interest of 20 MHz±the 5 MHz artifacts of the fixed pattern jitter, errors due to this sampling may be ignored.

This means of setting the frequency response of the filter is easily added to mechanism above to activate the drivers. A driver is enabled if the adjacent counter number falls in the range of 0 to 8 (or any two numbers differing by 8), and is enabled to drive in phase with the delay if the adjacent value in the delay line is a zero, and to drive anti-phase to the delay if the adjacent value in the delay line is a one.

Use of this embodiment is thus characterized by two factors. First, the effective length of the FIR filter used to remove fixed pattern noise is such that the delay in that length is equal to the interval over which the fixed pattern noise is known to repeat. (If it is only desired to remove certain noise frequencies, the effective length of the filter may be adjusted to be an integer divisor of the interval over which the fixed pattern to be removed repeats. Further, the interval of the delay may be a multiple of the interval over which the pattern repeats, in which case redundant zeros will be present which nominally contain no fixed pattern energy, but the filter will still work.)

Second, the coefficient values in the active length are such that the center frequency is substantially equal to the output frequency of the multiplier. (In the case of a band pass filter, there is no true center frequency; rather, this criteria merely becomes that the filter pass the desired output frequency.)

Figure 6:
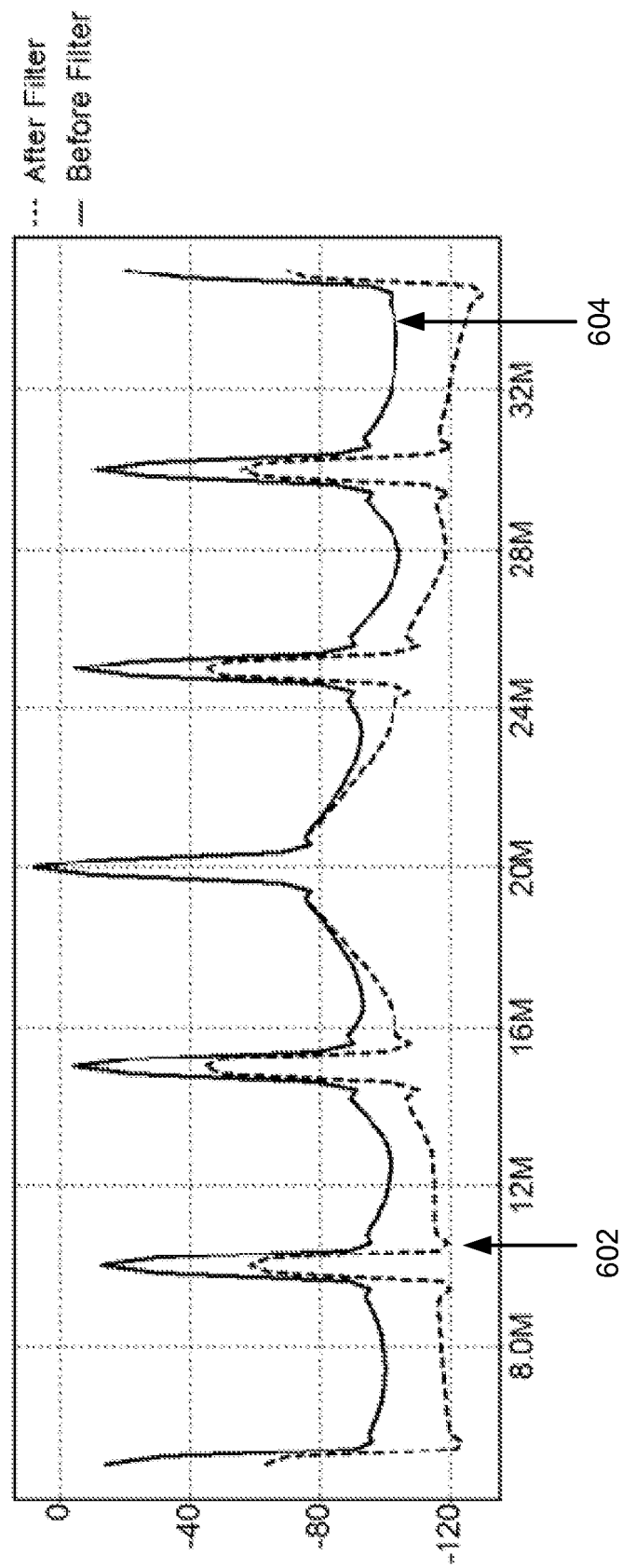
FIG. 6 is a of the Fourier transform of a 20 MHz signal created by multiplying a 5 MHz signal after removal of fixed pattern jitter according to one embodiment, overlaid on the graph of FIG. 1.

FIG. 6 shows a curve 602 of the Fourier spectrum of a 20 MHz signal after reduction of fixed pattern jitter, compared to the curve 604 of such a signal before noise reduction. It may readily be seen that noise at all frequencies other than 20 MHz is substantially reduced.

Figure 2:
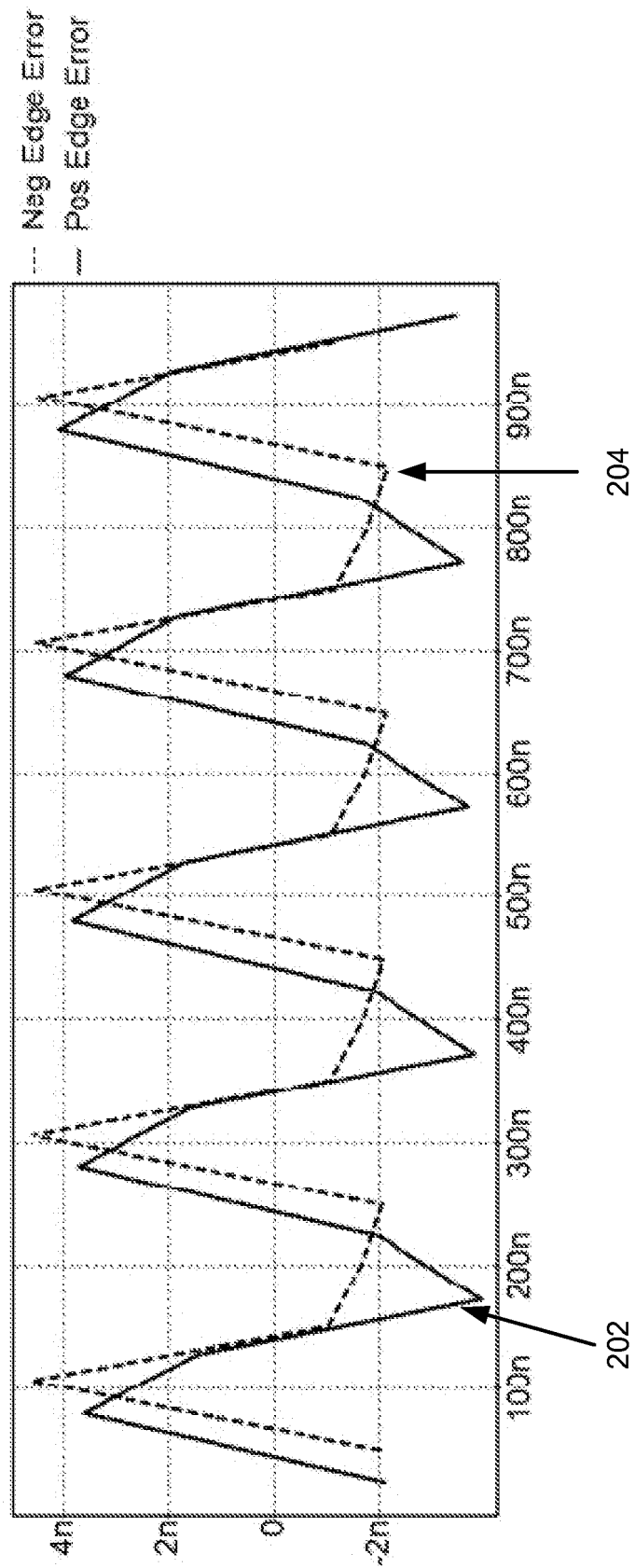
FIG. 2 is a graph of the edge positions plotted as a deviation from their ideal positions for the signal represented by the Fourier transform of FIG. 1.
Figure 7:
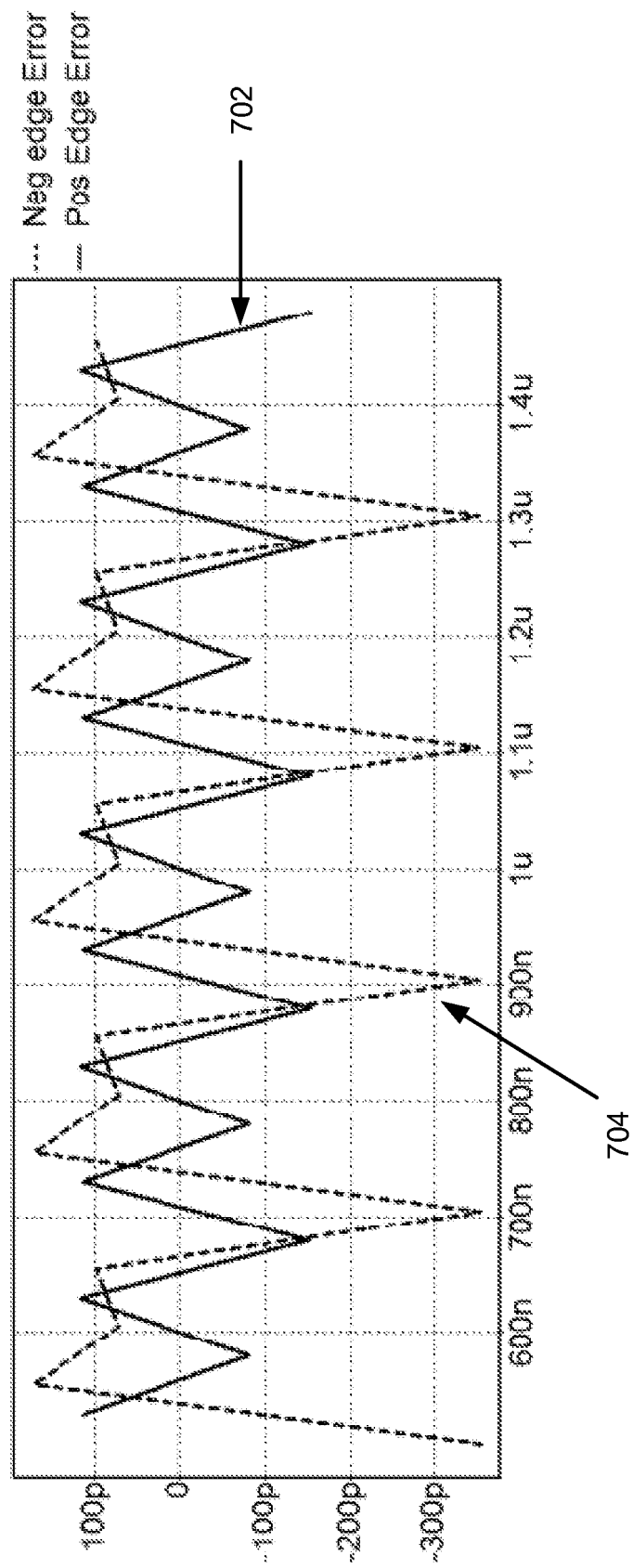
FIG. 7 is a graph of the edge positions plotted as a deviation from their ideal positions for the signal represented by the Fourier transform of FIG. 6.

FIG. 7 shows the dither in the new clock edges after reduction of the fixed pattern jitter, in which curve 702 shows the positive edge error and curve 704 shows the negative edge error. Comparing the dithering in FIG. 7 to that in FIG. 2 will make it further apparent how this embodiment reduces the noise in the 20 MHz clock signal, such that the variance in the position of the clock edges now ranges from about +175 PS to −350 PS, rather than ±4 NS as in FIG. 2.

Using the methods and filters described in this embodiment, the fixed pattern jitter present in any signal may be removed, without calibration or linear control, and with constant adjustment for variations in temperature, power supply and other changes. It also physically small and consumes low power.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

It should also be appreciated that the described method and apparatus can be implemented in numerous ways, including as a process, an apparatus, or a system. The methods described herein may be implemented by program instructions for instructing a processor to perform such methods, and such instructions recorded on a computer readable storage medium such as a hard disk drive, floppy disk, optical disc such as a compact disc (CD) or digital versatile disc (DVD), flash memory, etc. It may be possible to incorporate the described methods into hard-wired logic if desired. It should be noted that the order of the steps of the methods described herein may be altered and still be within the scope of the disclosure.

These and other variations upon the embodiments are intended to be covered by the present disclosure, which is limited only by the appended claims.

What is claimed is:

1. A method of designing a finite impulse response filter for removing fixed pattern jitter from a signal having a desired output frequency, the filter having a delay line containing a plurality of delay elements, comprising:

selecting a desired peak frequency response for the filter;

selecting a plurality of elements having impedances, one element to be coupled to the delay line after each delay element, the values of the elements selected to determine their impedances so that the filter is the equivalent of two filters, a first filter having a peak output frequency at the desired output frequency or a band pass range that includes the desired output frequency, and a second filter in which the signal is delayed by a time equal to half of a period of a different frequency which is desired to be removed from the output signal; and providing an output connected to all of the impedance elements.

2. The method of claim 1, wherein selecting a plurality of elements further comprises:

determining a plurality of Fourier coefficients that provides the peak output frequency at the desired output frequency or a band pass range that includes the desired output frequency;

for each set of Fourier coefficients, selecting a set of impedance values that are the inverse of the Fourier coefficients.

3. The method of claim 2, wherein determining a plurality of Fourier coefficients further comprises mathematically calculating the Fourier coefficients.

4. The method of claim 2, wherein determining a plurality of Fourier coefficients further comprises determining the Fourier coefficients by an iterative method.

5. The method of claim 4, wherein determining the Fourier coefficients by an iterative method further comprises determining the Fourier coefficients by a Parks-McClellan method.

6. The method of claim 2, wherein determining a plurality of Fourier coefficients further comprises multiplying the Fourier coefficients by a window function.

7. A finite impulse response filter for removing fixed pattern jitter from a signal having a desired output frequency, comprising:

an input for receiving the signal;

a delay line containing a plurality of delay elements;

a plurality of elements having impedances, one element coupled to the delay line after each delay element, the values of the elements selected to determine their impedances so that the filter is the equivalent of two filters, a first filter having a peak output frequency at the desired output frequency or a band pass range that includes the desired output frequency, and a second filter in which the signal is delayed by a time equal to half of a period of a different frequency which is desired to be removed from the output signal; and an output connected to all of the impedance elements.

8. A finite impulse response filter for removing fixed pattern noise from a signal having a desired output frequency, comprising:

an input for receiving the signal;

a delay line containing a plurality of delay elements, having a total delay that is longer than the period of the fixed pattern noise;

a plurality of elements having impedances, one element coupled to the delay line after each delay element;

a counter mechanism for counting the number of signal edges that have occurred as the signal passes each delay element in the delay line;

a controller for:

determining when the number of signal edges that occur at the desired frequency during the period of the fixed pattern has been reached and causing only the impedance elements coupled to delay elements in which those signal edges have occurred to be activated; and configuring the values of the activated impedance elements to provide a filter response having a peak output frequency at the desired output frequency or a band pass range that includes the desired output frequency; and an output connected to all of the impedance elements.

* * * * *